United States Patent [19]
Frenkel et al.

[11] Patent Number: 4,733,932
[45] Date of Patent: Mar. 29, 1988

[54] HOUSING FOR AN OPTOELECTRONIC CIRCUIT MODULE

[75] Inventors: Ferdinand Frenkel, Augsburg; Herbert Prussas, Reichertshausen; Lothar Rapp, Munich, all of Fed. Rep. of Germany

[73] Assignee: Siemens Aktiengesellschaft, Berlin and Munich, Fed. Rep. of Germany

[21] Appl. No.: 899,192

[22] Filed: Aug. 22, 1986

[30] Foreign Application Priority Data

Sep. 5, 1985 [DE] Fed. Rep. of Germany ....... 3531746

[51] Int. Cl.$^4$ .............................................. G02B 6/42
[52] U.S. Cl. .............................. 350/96.20; 350/96.15; 357/81
[58] Field of Search .............. 350/96.15, 96.16, 96.17, 350/96.20; 250/227; 357/17, 19, 30, 74, 80, 81

[56] References Cited

U.S. PATENT DOCUMENTS 3,029,505 4/1962 Reichenbaum ..................... 29/501
4,399,453 8/1983 Berg et al. .
4,403,243 9/1983 Hakamada .................. 350/96.2 X

FOREIGN PATENT DOCUMENTS 0111264 6/1984 European Pat. Off. .
3337131 4/1985 Fed. Rep. of Germany .
57-164583 10/1982 Japan .

OTHER PUBLICATIONS

Archey et al., "Low Loss Optical Coupler", *IBM Technical Disclosure Bulletin*, vol. 22, No. 12, May 1980, pp. 5288–5290.
Dassele et al., "Packaging Hybrid Circuit Fiber Optic Transmitters and Receivers", *Electronic Packaging and Production*, vol. 20, No. 1, Jan. 1980, pp. 135–141.

*Primary Examiner*—John Lee
*Assistant Examiner*—Michael Menz
*Attorney, Agent, or Firm*—Lawrence C. Edelman

[57] ABSTRACT

A housing for an optoelectronic circuit module useful in a glass fiber communications system including a luminous flux suspended into the housing. The flux is conducted in a vacuum or a gas, between first and second mutually positioned optical components. The first optical component is attached to the housing via a first support, and a second optical component is attached to the housing via a second support. The first support is installed in one of the housing walls or inside the housing and the second support is rigidly attached to an interior section of the housing. In operation, at least the second support is subjected to large temperature variations of e.g., between −40° C. and +130° C. At least the interior section of the housing which is adjacent to the second support is comprised of a first weldable material and has a first linear thermal expansion coefficient. At least a portion of the second support which is adjacent to the interior section of the housing is comprised of a second weldable material which has a second linear thermal expansion coefficient which differs from the first expansion coefficient. Installed inside the housing is at least one electronic component, e.g., an infrared light-emitting diode which, during operation, produces increases in temperature inside the housing due to waste heat. The second support is located adjacnet to the interior section of the housing, but is welded via only a comparatively small point-like spot to the interior section.

13 Claims, 1 Drawing Figure

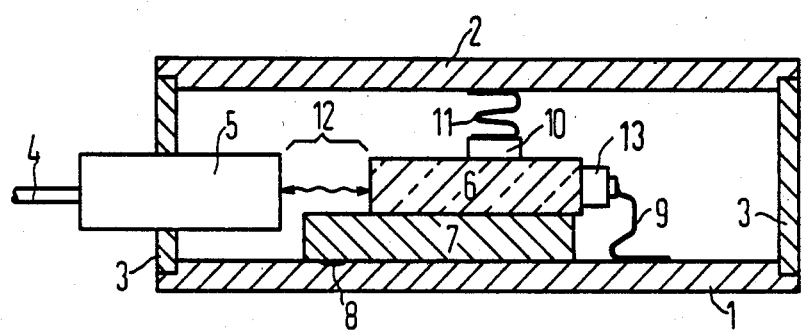

HOUSING FOR AN OPTOELECTRONIC CIRCUIT MODULE

BACKGROUND OF THE INVENTION

1. Field of the Invention

This invention relates to a housing for an optoelectronic circuit module and in particular to a housing which takes into account thermal expansion considerations.

2. Description of the Prior Art

One type of housing for an optoelectronic circuit module is known, for example, from DE-OS No. 33 37 131. Described therein is the formation of a first optical component including the tip of a glass fiber and a second optical component including an optoelectronic semiconductor diode. The luminous flux path between the components is extremely short and adjustments thereof must lie within tolerances of 1 μm (micron) or, in some instances, far below this level.

It is desirable that the adjustment of the two optical components remain unaltered, even when variations in the operating temperature occur, in order to prevent variations of the transmitted luminous flux.

SUMMARY OF THE INVENTION

An object of the invention is to permit by simple means very large tolerances in the assembled housing for the permissible operating temperatures, and thus for the permissible variations thereof (e.g., variations ranging from −40° C. up to +80° C., or even up to +130° C. and above if required) without risking the occurrence of internal mechanical stresses which might prove damaging for the operation of the housing. Such stresses in the housing can cause not only chipping of the fastening means between the housing and the second optical component, but also, as often occurs, warps of varying degrees which, in turn, cause varying degrees of optical maladjustments of the luminous flux path.

In accordance with the invention, this object is achieved by ridgidly attaching a support for the second optical component to an internal section of the housing using only a relatively small point-like spot e.g., a spot weld.

A further object of the invention is to permit a very large space between the support and the housing, instead of having to reduce this space to a minimum for the sake of avoiding internal stresses which would result in optical maladjustments.

A further object of the invention is to permit, with a very high degree of precision, the prevention of optical maladjustments within a very large temperature range, even when the space between the support and the housing is very much larger, e.g., 10,000 times larger, than the length of the luminous flux path.

A further object of the invention is to permit a large-area rigid attachment of the second component, e.g., of a prism, a lens, or any other kind of large and heavy second optical component, to which can be attached a support consisting, wholly or essentially, of a type of material different from the material of the housing.

A further object of the invention is to permit reduction of the heat load, particularly that of the second optical component and/or of its support, to a minimum so that the waste heat of the electrical component or components is in each case evacuated with minimum thermal resistance through a thermally conductive body, e.g., via a conducting spring consisting of a CuNiBe alloy, directly to the housing and via the outer surface of the housing to external heatsinks, e.g., to the passage of cooling air.

A further object of the invention is to permit use of a housing for a module of a glass fiber communications system which includes an optoelectronic converter.

A further object of the invention is to permit the use of a converter assembly within the housing, the assembly being similar to the one referred to in the forenoted DE-OS No. 33 37 131.

A further object of the invention is to permit use of a directional coupler as the converter assembly for optically connecting at least two optoelectronic components with a glass fiber.

A further object of the invention is to permit the reliable determination of the position of the points which are to be welded.

A further object of the invention is to avoid undesirable weldings outside the points which are to be welded,. i.e., between the support for the second component and the interior section of the housing.

These and other features and advantages of the invention will be apparent from the following description of the preferred embodiments, and from the claims.

For a fuller understanding of the present invention, reference should now be made to the detailed description of preferred embodiment of the invention and to the accompanying drawing.

BRIEF DESCRIPTION OF THE DRAWING

The sole FIGURE illustrates a housing for an optoelectronic circuit module of a glass fiber communications system, constructed in accordance with the principles of the invention.

DETAILED DESCRIPTION OF THE PREFERRED EMBODIMENT

The housing is comprised of a bottom 1, lateral walls 3, and a cover 2. The housing has an overall dimension of 25 mm × 15 mm × 8.5 mm.

A luminous flux is launched along a path 12 inside the housing and conducted in a vacuum or in a gas. For the sake of clarity the length of luminous flux path 12 is shown as very large, whereas flux path 12 can also be extremely small, e.g., only a few μm or even smaller (such as the luminous flux path described in the forenoted DE-OS No. 33 37 131). The length of flux path 12 is defined by the mutual position of first and second optical components 4 and 6 which limit the flux. In the example shown, the first optical component is illustrated as the tip of a glass fiber 4 which is held in position by a connector 5, and the second optical component is formed, for example, by an optoelectronic semiconductor diode 6, i.e., an infrared light-emitting diode (such as described in the forenoted DE-OS No. 33 37 131). The mutual adjustment (i.e., position) of optical components 4 and 6 determines the length and direction of luminous flux path 12 within housing 1, 2, 3. The adjustment of luminous flux path 12 must occasionally maintain very small tolerances and frequently has not only a very small tolerance in the axial direction relative to glass fiber 4, but also often has an extremely small tolerance in the radial direction relative to glass fiber 4.

In particular, it has been found that the internal mechanical stresses occuring within the housing can so warp the mechanical components thereof that, when experiencing strong temperature variations, the adjustment of luminous flux path 12 is no longer able to maintain the required tolerances. In particular, it was found that temperature variations caused such strong convex and concave deformations of bottom 1 of the housing that the radial adjustment of luminous flux path 12 was unable to maintain the desired tolerance of, for example, ±0.2 μm. As far as glass fiber 4 is concerned, considerable changes in length of luminous flux path 12 in the axial direction could also accasionally be observed.

An in-depth investigation showed that strong deformations, in particular those of housing bottom 1, could be avoided by welding the support 7 (shown schematically in the Figure) of second optical component 6 to botton 1 via a small predominantly point-like spot weld 8. In the prior art, the entire surface area of support 7 which is adjacent to bottom 1 was rigidly connected with its large surface to bottom 1. However, in the present invention, after welding, the surface of spot 8 is, for example, only a small portion of the area of support 7 which is facing and adjacent to bottom 1. This largely prevents the internal mechanical stresses at bottom 1, which occur in the prior art housings during strong temperature variations due to extremely variable linear thermal expansion coefficients of the materials used for bottom 1 and support 7.

The following general rules can be derived from the invention:

(1) It is a requirement that housing 1, 2, 3 contain a luminous flux path 12 between two optical components.

(2) That the first optical component be attached by some means to the housing, which means is between the two optical components 4, 6 i.e., between the prisms, lenses, glass fiber tapers, or similar, and that therefore the support 5 for the first optical component be attached to at least one of the housing walls 3, or within the housing 1, 2, 3.

(3) It is a further requirement that support 7 for the second optical component 6, be attached to an internal section of the housing, e.g., an inner surface of bottom 1.

(4) That materials of the inner section of bottom 1 and, at least that portion of support 7 which is adjacent to the inner section of bottom 1 are always made of a weldable material.

Concerning the last-mentioned general rule, the material of the inner section of bottom 1 should have a strongly deviating linear thermal expansion coefficient in comparison to the material of support 7. Additionally, strong temperature variations are a further factor, e.g., when using the module in a glass fiber communications system which must function with absolute reliability, even under the most extreme thermal conditions; ranging from extreme cold, i.e., −60° C.or −40° C., to very high operating temperatures of, for example, 80° C. or even far above that, e.g., 130° C. Such increases in operating temperature occur during the operation of the circuit module in a glass fiber communications system because, for example, an electronic component e.g., and infrared light-emitting diode and/or a pre-amplifier (e.g., a semiconductor driver chip) is installed inside of housing 1, 2, 3. During operation, electronic components of this type frequently emit very high and at times extremely variable amounts of waste heat which often produces a relatively great increase in the temperature of the housing, which housing is often extremely small. Apart from this, housings for optoelectronic circuit modules of the type which are used in glass fiber comnmuniations systems are often very difficult to cool from the outside because an extremely large number of such housings must be accommodated in a very small space of a cabinet. Thus, the admission of cooling air is difficult and, furthermore, the volume of waste heat to be evacuated from the housing by the cooling air is extremely high. Therefore, during operation, the housings must withstand extremely high temperature variations and ensure extreme long-term reliability, without causing any breakdowns in the communications system. The invention, therefore, enables the maintenance of extremely small tolerances of adjustment for luminous flux path 12 even under very difficult operating conditions, in that, under the given requirements, although support 7 is located adjacent to a relatively large section of the housing, in this case bottom 1, support 7 nevertheless is attached (welded) via a relatively small, predominantly point-like spot 8, to bottom section 1.

Such a point-like welding at a very small segment of the relatively large surface of bottom 1 can be undertaken by various methods. Prior to welding one can, for example, impress a burl into bottom 1 at the relevant point 8, as shown in the Figure, which presents a slight elevation. The flat base area of support 7 is then pressed upon bottom 1 and welded at point 8. Apart from such a burl, which can also be attached to the base area of support 7 instead of bottom 1, all parts of the section between support 7 and bottom 1 which are not to be welded can additionally be covered with an electrically insulating (hardened) coat of lacquer. This has the effect that welding can be performed at small point 8 with a high degree of reliability and at a very low reject rate. Furthermore, instead of attaching a burl to point 8 which is to be welded, one can, prior to welding at point 8, attach a small piece of metal, e.g., a strip of sheet metal, between bottom 1 and support 7 or, for instance, bond a small piece of wire between the components, so that the additional metal parts between the section of the housing and support 7 produce at point 8 at point-like welding, in a manner similar to the aforesaid burl.

From the above description it follows that the section of the housing adjacent to support 7 is not necessarily a section of the bottom 1 of the housing. Instead, it can also be another component of the housing, e.g., cover 2 or a lateral wall 3 of the housing. Likewise, it can also be an additional platform inside the housing which can be directly or indirectly attached at any point to an external component 1, 2, 3. From this it also follows that both supports 5 and 7 for optical components 4 and 6 can respectively be rigidly interconnected via other mechanical components, without foregoing the advantage offered by this invention of avoiding internal mechanical stresses during temperature variations. The invention thus offers the advantage of not being committed to a special assembly inside of the housing. In particular, the aforesaid internal stresses must also be avoided when supports 5 and 7 themselves do not have a specific shape or design. The invention thus offers a correspondingly wide field of application.

Even during extreme temperature variations, the tolerances for luminous flux path 12 can be maintained with a high degree of precision, provided that point 8 at which the section of the housing is welded with support 7 is chosen very carefully. Each of components 4, 5, 3, 1, 7, 6 can be comprised of various metals, each of which has a completely different linear thermal expansion coefficient. At each temperature, each of these various components 4, 5, 3, 1, 7, 6 respectively produces a maladjusting effect to luminous flux path 12, not only in the longitudinal direction (i.e., in the axial direction of glass fiber 4, as shown in the example) but also vertically thereto (i.e., radially to glass fiber 4). Overall, the various expansions of components 4, 5, 3, 1, 7, 6 will partly be greater and partly be smaller than one another, depending on the shape, material and point of installation of the relevant components. In accordance with the principles of the invention it is now possible to make almost any changes to the section inside the housing 10 which is adjacent to support 7, and, in particular, to perform any changes to the position of the point 8 within the inside section, irrespective of the materials of which individual components 4, 5, 3, 1, 7, 6 are comprised and irrespective of the shapes thereof. Therefore, it is particularly advantageous to select point 8 within the section in such a way that to a large extent thermal expansion of any of components 4, 5, 3, 1, 7, 6 are mutually compensated for between the ends of luminous flux path 12. In the example shown in the Figure, the axis of glass fiber 4 is located parallel to the surface of the inner section of bottom 1 at which point 8 is located. During temperature variations, the maladjustment of luminous flux path 12 be minimized due to the varying thermal expansion coefficients and as a result of the skillful selection of the location of point 8. The maladjustment of luminous flux path 12 is reduced even further when the chosen direction of luminous flux path 12, (i.e., in the example shown, the direction of the axis of the glass fiber 4) is not parallel but is optimally at a slant to the surface of the inner section of bottom 1. Thus, when selecting a suitable position for point 8, both axial and radial maladjustments of luminous flux path 12 are minimized.

The invention is therefore also not limited to the selection of very specific linear thermal expansion coefficients for components 4, 5, 3, 1, 7, 6, (i.e., to the use of a single very specific combination of materials and shapes). Thus, the invention permits the second optical component 6 to be comprised of a material having a linear thermal expansion coefficient which, in comparison with the linear thermal expansion coefficients of the remaining materials, is in essence similar to the linear thermal expansion coefficient of support 7 for component 6. Consequently, it will be possible to rigidly connect large area of second optical component 6 with its support 7, without risking any considerable internal mechanical stresses at the connection.

Nor is the invention limited to very specific electronic components which emit waste heat during operation. However, if the electronic components emit strong the relatively fast-changing waste heat, the adjacent areas of the housing connected with the electronic components, and which have good thermal conductivity, are subjected to strong temperature variations in relation to the rate of thermal expansion, whereas the more distant components of the housing are subject to very small temperature variations and, in fact, merely subject to delays. In this case the rhythmic misadjustment of luminous flux path 12 is occasionally much greater than permissible. Thus, it is advantageous to connect with heatsinks 9 and 10 the waste-heat emitting electronic components, or at least a part thereof, to those inner surfaces of the housing through which the waste heat can quickly be evacuated via the outer surface of the housing to areas adjacent the housing. The heatsink connections should have good thermal conductivity. Springs made of a good thermally conductive material, i.e., a CuNiBe alloy, are suitable as heatsinks 9, 11, because springs accommodate large tolerances between their respective ends.

In modules of a glass fiber communications system including housings assembled in accordance with the invention, the first optical component 4 may be the tip of a glass fiber which is held by a glass fiber connector 5. Such modules can even have two luminous flux paths, in the housing. According to a further aspect of the invention, each of the flux paths can be set up separately: that is to say, a first luminous flux path between a tip of glass fiber 4 and a collector lens, e.g., a ball lens, for a more concentrated bunching of the light, as well as a second flux path between the collector lens and an optoelectronic component. Furthermore, additional optical components can be rigidly arranged between the luminous flux path and the optoelectronic component and, at the same time, the optical components can be optically connected in series to the optoelectronic component. For example, a quartz element or a glass element which, for example, contains glass fibers which are so embedded that the element serves as a directional coupler for branching the luminous path, via the glass fiber into several paths, e.g., to two optoelectronic components 10 and 13 which are installed inside the housing.

In such a directional coupler, electronic component 13 can, for example, be a light-emitting diode which supplies a different wavelength of light than that emitted by light-emitting diode 10. If light-emitting diodes 10 and 13 are installed inside of the housing, their light is generally individually emitted via glass fiber 4 from housing 1, 2, 3. If light-receiving diodes are provided inside the housing, light is generally transmitted to the light receiving diodes via glass fiber 4 from the outside of the housing. Instead of two light-emitting diodes 10 and 13, it is possible to install other components, e.g., two light-receiving diodes 10 and 13, respectively, in the housing.

Thus, there has been shown and described a novel housing for an optoelectronic circuit module which fulfills all the objects and advantages sought therefore. Many changes, modifications, variations and other uses and applications of the subject invention, in addition to those already noted above, will, however, become apparent to those skilled in the art after consideration of this specification and its accompanying drawings which disclose only preferred embodiments thereof. All such changes, modifications, variations and other uses and applications which do not depart from the spirit and scope of the invention are deemed to be covered by the invention which is limited only by the claims which follow.

We claim:

1. A housing for an optoelectronic circuit module useful in a glass fiber communications system, wherein:
   first and second optical components which transmit or receive a luminous flux beam are mutually positioned inside said housing so as to establish a luminous flux path therebetween, the amount of flux conducted by said flux path between said optical components being reduced by relatively slight movement between said mutually positioned optical components, said flux path being conducted in a vacuum or a gas;
   said first optical component being attached to said housing via a first support, and said second optical component being attached to said housing via a second support, said first support being installed in a wall of said housing or inside said housing and said second support being rigidly attached to a section of said housing which is inside said housing;

said second support being subjected to high temperature variations during operation of said circuit module;

at least said inside section of said housing attached to said second support is comprised of a first material which is weldable and has a first linear thermal expansion coefficient;

at least that section of said second support which is attached to said inside section of said housing is comprised of a second material which is weldable and has a second linear thermal expansion coefficient which differs from said first linear thermal expansion coefficient by an amount which will cause said relatively slight movement to develop between said optical components which will reduce the amount of flux conducted by said flux path; and at least one optoelectronic component installed inside said housing, said component being capable of producing increases in temperature of said second support due to waste heat during its operation; and a relatively small point-like spot weld between said second support and a relatively large section of said housing which is adjacent to said second support for attaching said second support to said inside section of said housing, which weld provides said rigid attachment of said second support to said housing in a manner which reduces the amount of movement which can develop between said optical components due to said difference between said first and second thermal expansion coefficients, thereby minimizing said reduction in the amount of flux conducted by said flux path.

2. A housing according to claim 1, wherein:
said first and second supports are rigidly interconnected via additional mechanical components.

3. A housing according to claim 2 wherein:
the position of said point-like spot weld within said inside section of said housing is so selected that all thermal expansions due to changes in temperature of all components located between said first and second optical components are at least mutually compensated.

4. A housing according to claim 3 wherein:
said second optical component is comprised of a material having a third linear thermal expansion coefficient, which, when compared with said first and said second linear thermal expansion coefficients, is very similar to said second linear thermal coefficient.

5. A housing according to claim 1 wherein:
the position of said point-like spot weld within said inside section of said housing is so selected that all thermal expansions due to changes in temperature of all components located between said first and second optical components are at least mutually compensated.

6. A housing according to claim 1, wherein:
said second optical component is comprised of a material having a third linear thermal expansion coefficient, which, when compared with said first and said second linear thermal expansion coefficients, is very similar to said second linear thermal coefficient.

7. A housing according to claim 1, wherein:
at least some of said electronic components positioned in said housing emit waste heat into said housing during their operation, said electronic components being connected via their own heatsinks to an inner surface of said housing.

8. A housing according to claim 7, wherein:
said first optical component comprises the tip of a glass fiber which is held by a glass fiber connector support; and at least one of said electronic components is a light-emitting diode whose emitted light is conducted in a bunched form from said housing via said luminous flux path as well as said glass fiber.

9. A housing according to claim 1, wherein:
said first optical component comprises the tip of a glass fiber which is held by a glass fiber connector support; and at least one of said electronic components is a light-emitting diode whose emitted light is conducted in a bunched form from said housing via said luminous flux path as well as said glass fiber.

10. A housing according to claim 9, wherein:
said second optical component is a light-emitting diode which is held by a support comprising a metal base.

11. A housing according to claim 9, wherein:
said second optical component comprises a directional coupler containing a quartz or glass element which is optically interconnected with two optoelectronic components which are attached to the inside of said housing, said second optical component being held by a second support comprising a metal base.

12. A housing according to claim 1, further including:
a metallic intermediate piece attached to the point which is to be welded between said inner section of said housing and said second support.

13. A housing according to claim 12, further including:
a coat of electrically insulating lacquer covering the parts of said inner section of said housing located adjacent said second support and outside of said spot weld.

* * * * *